United States Patent
Sachan et al.

(10) Patent No.: US 7,751,219 B2
(45) Date of Patent: Jul. 6, 2010

(54) THREE PORT CONTENT ADDRESSABLE MEMORY

(75) Inventors: Rashmi Sachan, Bangalore (IN); Vasudha Gupta, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 11/964,048

(22) Filed: Dec. 26, 2007

(65) Prior Publication Data

US 2009/0168479 A1   Jul. 2, 2009

(51) Int. Cl.
*G11C 15/00* (2006.01)
(52) U.S. Cl. .................... 365/49.17; 365/49.1
(58) Field of Classification Search ............... 365/49.17
See application file for complete search history.

(56) References Cited

U.S. PATENT DOCUMENTS 6,339,539 B1 * 1/2002 Gibson et al. ............ 365/49.18
6,707,693 B1 * 3/2004 Ichiriu ..................... 365/49.17
2004/0114411 A1 * 6/2004 Noda et al. ................... 365/49
2004/0223364 A1 * 11/2004 Srivastavaan et al. ....... 365/154

* cited by examiner

*Primary Examiner*—Hoai V Ho
*Assistant Examiner*—Anthan T Tran
(74) *Attorney, Agent, or Firm*—Dawn V. Stephens; Wade James Brady, III; Frederick J. Telecky, Jr.

(57) ABSTRACT

A novel schematic for executing search, write and valid bit clear operations in one cycle in a CAM system that includes a plurality of CAM blocks is disclosed. In one embodiment, the plurality of CAM blocks are organized into at least one rectangular array having rows each having a plurality of CAM blocks, a group of CAM cells and associated read/write bit lines connecting the group of CAM cells to an addressed search circuit. The write operation depends on the output of the search operation, wherein the same data is written in to the CAM when the search operation results in a miss in a given cycle. Further, during the same cycle a valid bit clear operation is also performed. The resulting CAM cell provides a high speed three port operation.

10 Claims, 8 Drawing Sheets

THREE PORT CONTENT ADDRESSABLE MEMORY

TECHNICAL FIELD OF THE INVENTION

The present invention relates generally to digital integrated circuits, and more particularly relates to content addressable memories (CAMs).

BACKGROUND OF THE INVENTION

Content Addressable Memories (CAMs) are commonly used in cache systems, and other address translation systems, of high speed computing systems. They are also useful in high-speed network routers, and many other applications known in the art of computing. CAMs can be Binary (logic states, zero and one) or Ternary (logic states zero, one and don't care).

A CAM system is composed of CAM blocks with arrays of CAM cells. A CAM system typically has a CAM block array (M×N) that includes a plurality of rows (M) and a plurality of columns (N). Further, each row has a plurality of CAM blocks, and each CAM block has a plurality of CAM cells. These arrays typically have vertically running bit lines and search lines for data read/write function and horizontal running word lines and match lines. All CAM cells in a column share the same bit lines and search lines, whereas, the word lines and match lines are shared by all cells in a row. Each CAM cell includes a pair of memory elements and a corresponding pair of compare circuits.

The CAM cells are characterized by circuitry, capable of generating a match output for each row of CAM blocks in the CAM cell, thereby indicating whether any location of the array contains a data pattern that matches a query input and the identity of that location. Each CAM cell typically has the ability to store a unit of data, and the ability to compare that unit of data with a unit of query input and each CAM block has the ability to generate a match output. In parallel data search, an input keyword is placed at the search bit lines after precharging the match lines to a power supply voltage Vdd.

The data in each CAM cell connected to a match line is compared with this data, and if there is a mismatch in any cell connected to a match line, the match line will discharge to ground through the compare circuit of that CAM cell. A compare result indication of each CAM block in a row is combined to produce a match signal for the row to indicate whether the row of CAM cells contains a stored word, matching a query input. The match signals from each row in the CAM cell together constitute match output signals of the array, and these signals may be encoded to generate the address of matched locations or used to select data from rows of additional memory.

Each CAM cell in each column is typically connected to a common read/write bit line pair and search bit line pair. The common read/write bit line is used to write the data to a pair of memory cells, which can be a part of a CAM cell. Each memory cell is accessed using a word line which is decoded using an input address. The common read/write bit line is also used for reading the data from a memory cell. The differential developed across the read/write bit lines are sensed using a sense amplifier during a read cycle.

Further, each CAM cell in each column is typically connected to a common query data line, also referred to as a common search bit line. The common search bit line enables simultaneous data searching in each CAM cell in a column from a query input. The common search data line can also be used as a write data line, when the CAM cell is based on a PMOS compare circuit.

Each CAM cell in each column of a CAM array is typically connected to a common read/write bit line and a search bit line. The common read/write bit line is used to write the data to a pair of memory cells, which can be part of a single memory cell, such as a binary CAM. Each memory cell is accessed using a word line which is decoded using an input address. The common read/write bit line is also used for reading the data from a memory cell. The differential developed across the read/write bit lines are sensed using a sense amplifier during a read cycle.

Further, each CAM cell in each column in the CAM arrays is typically connected to a common query data line, also referred to as a common search data line. The common search data line enables simultaneous data searching in each CAM cell in a column from a query input. The common search data line can also be used as a write data line, when the CAM array is based on a PMOS compare circuit.

The unit of data that is stored in a BINARY cell is binary, having two possible states: logic one, and logic zero. To store these two states, two memory elements are needed. CAM blocks of these binary CAM cells produce a local match compare result if the query input is equal to the data stored in the CAM cells in the CAM blocks, the query input contains a don't care state, or the data stored is a don't care data. The CAM cells produce a mismatch result otherwise. The CAM cells are particularly useful in address translation systems that allow variable sized allocation units.

During normal operation of a CAM, whenever data is searched, and if there is a hit HT during one clock cycle, all contents of the TCAM cell are searched and if the number of matches is more than one, the multi hit flag MH is raised, which signifies that there are more than one hits in the CAM system. In case of a multi hit match, the multibit address LSB gives out LSB HA as output. Conventionally, in a CAM array, at a given time, one clock cycle is used for performing each of the reading and writing operations. This CAM is also referred to as a one port or single port, denoting that a single clock cycle is used while performing a single function of operation of the CAM. Generally, current CAM arrays cannot perform more than one operation, i.e., search, write, and/or valid bit reset operations in a given clock cycle.

SUMMARY OF THE INVENTION

A novel technique for executing search, write and valid bit clear operations in one cycle is disclosed. According to an aspect of the subject matter, there is a technique for providing a three port CAM function. The three port CAM achieves upto three operations of search, write and/or validbit clear in one cycle. The write depends on the output of the search operation, where the same data is written if the search operation results in a miss.

The apparatus includes a write/search bit line decoder and driver circuit, a CAM cell array including multiple CAM cells. The CAM cell array is organized into at least one rectangular array having rows, each row having a plurality of CAM cells, and each CAM cell is associated with a row and a column of the CAM cell array, and further associated with a row and a column in a CAM block. Each CAM cell includes an associated read/write bit line coupled between each CAM cell and the write/search bit line decoder and driver circuit. During a write cycle, the write bit line decoder and driver circuit writes a data bit to each CAM cell via an associated read/write bit line.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION OF THE INVENTION

A novel technique for executing search, write and valid bit clear operations in one cycle is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The terms "CAM cell array" and "CAM device" are used interchangeably throughout the document.

Figure 1:
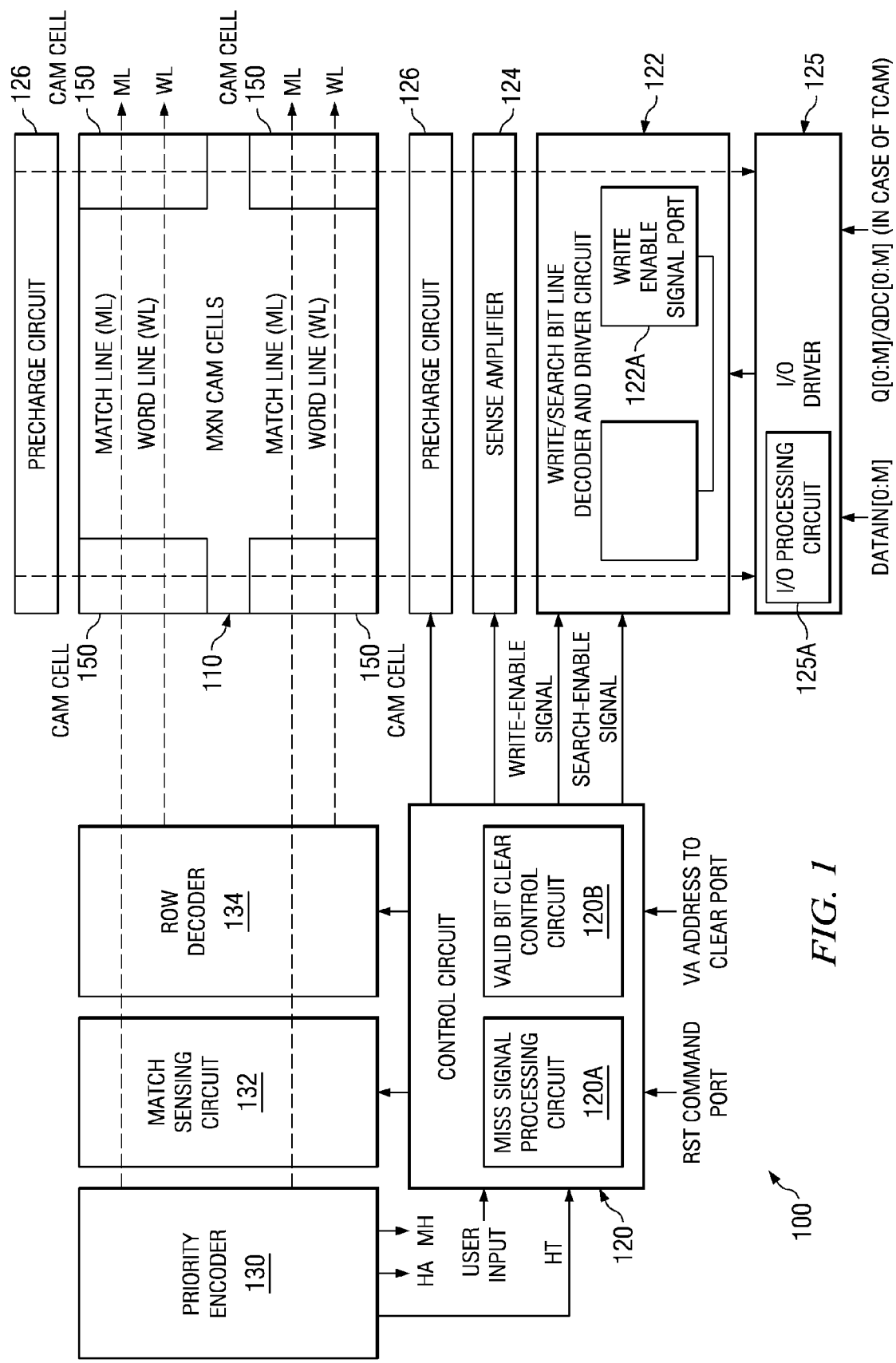
FIG. 1 is an architecture block diagram of a three port CAM system, according to an embodiment of the present invention.

FIG. 1 is an architecture block diagram of a three port CAM system 100, according to an embodiment of the present invention. The CAM system 100 includes a CAM cell array 110, a control circuit 120, a write/search bit line decoder and driver circuit 122, a sense amplifier 124, a read/write bit line and search bit line precharge circuit 126 and an input/output (I/O) driver 125 which includes an I/O processing circuit 125A. Further, the control circuit 120 includes a miss signal processing circuit 120A and a valid bit clear control circuit 120B. As shown in FIG. 1, the CAM system 100 further includes a priority encoder 130, a match sensing circuit 132, and a row decoder 134.

Further as shown in FIG. 1, the CAM cell array 110 includes multiple CAM cells 150 which are organized into at least one rectangular array having a plurality of rows, and each row has a plurality of CAM cells 150. In some embodiments, the CAM cell array 110 is arranged to include (M×N) CAM cells 150 which has M number of rows and N number of columns. As shown in FIG. 1, each of the plurality of CAM cells 150 has an associated match line (ML) and a word line (WL). In some embodiments, the CAM cell 150 of the CAM cell array 110 may be a BCAM (i.e., Binary CAM) cell or a TCAM (i.e., Ternary CAM) cell.

Figure 3:
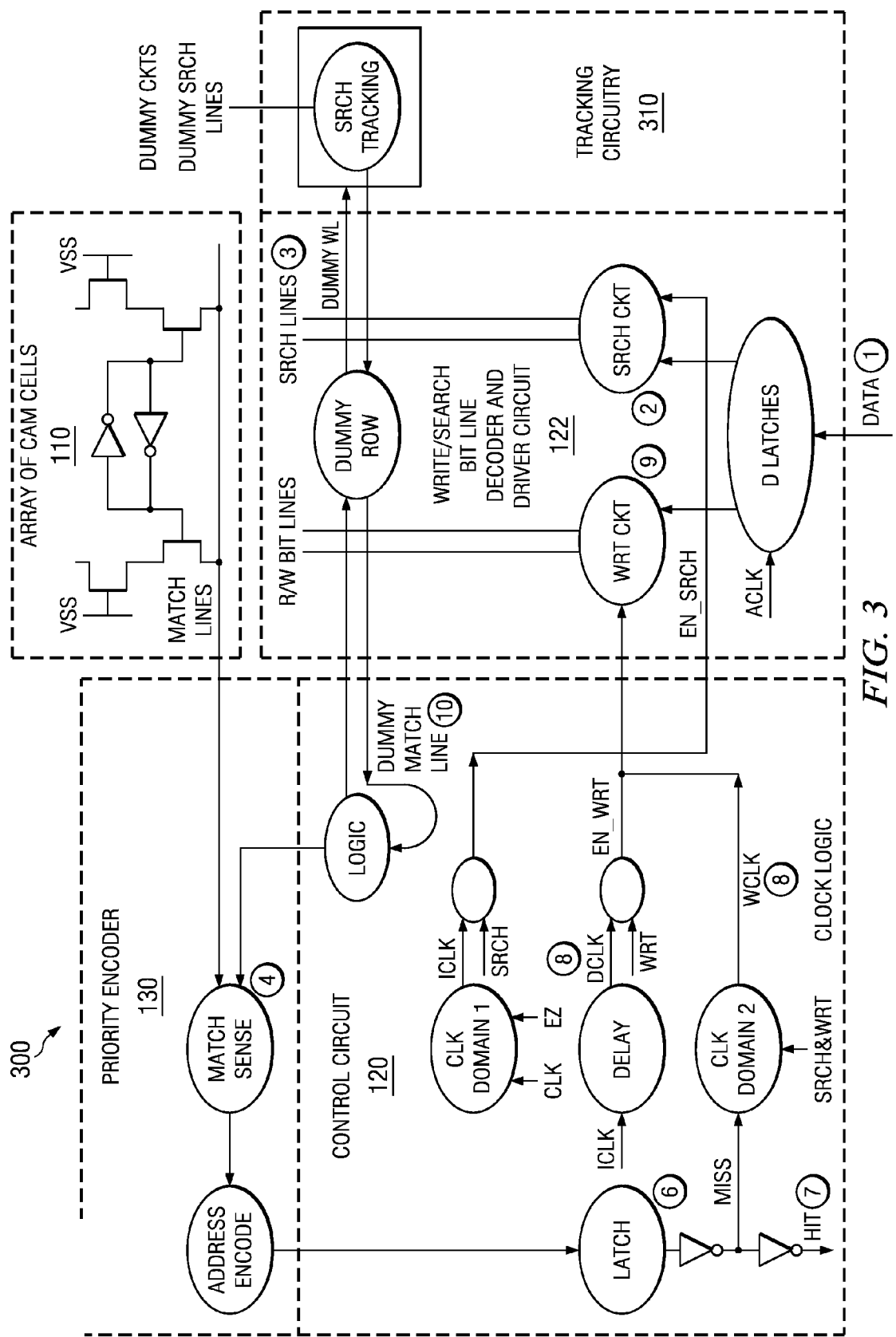
FIG. 3 is a circuit diagram illustrating the major components and their interoperations during a clock cycle of the three port CAM shown in FIG. 1, according to an embodiment.

As illustrated in FIG. 1, the control circuit 120 receives user input and is in communication with the precharge circuit 126, the sense amplifier 124, the write/search bit line decoder and driver circuit 122, and the I/O driver 125. The I/O driver 125 communicates with the control circuit 120 and the write/search bit line decoder and driver circuit 122. The I/O driver 125 receives the external input signals DATAIN [0: m] and DCMIN [0: m] (in case of TCAM) in search and write operations and sends output signals Q [0: m] and QDC [0: m] (in case of TCAM) in read operation, where m is the number of data bits. The associated read/write bit lines and the corresponding read/write bit complement lines (e.g., as shown in FIG. 3) are coupled to the one or more precharge circuits 126, the sense amplifier 124, and the write/search bit line decoder and driver circuit 122.

The DATAIN is a user input data, provided to compare with stored data in the CAM cell array 110. The DCMIN (for TCAM) is a user data compare input. For example, if DCMIN is high, then the input value is considered as a don't care input and value at DATAIN is not compared. The priority encoder 130 receives the match signals from the match sensing circuit 132 and outputs HA (Hit Address) or MH (Miss Hit), based on the comparison. The control circuit 120 receives the hit/miss signals from the priority encoder 130 and generates write-enable and search-enable signals.

The write/search bit line decoder and driver circuit 122 receives the write-enable and search-enable input signals from the control circuit 120. The Q and QDC (in case of TCAM) outputs are read output signals, received from the I/O driver 125.

Figure 2:
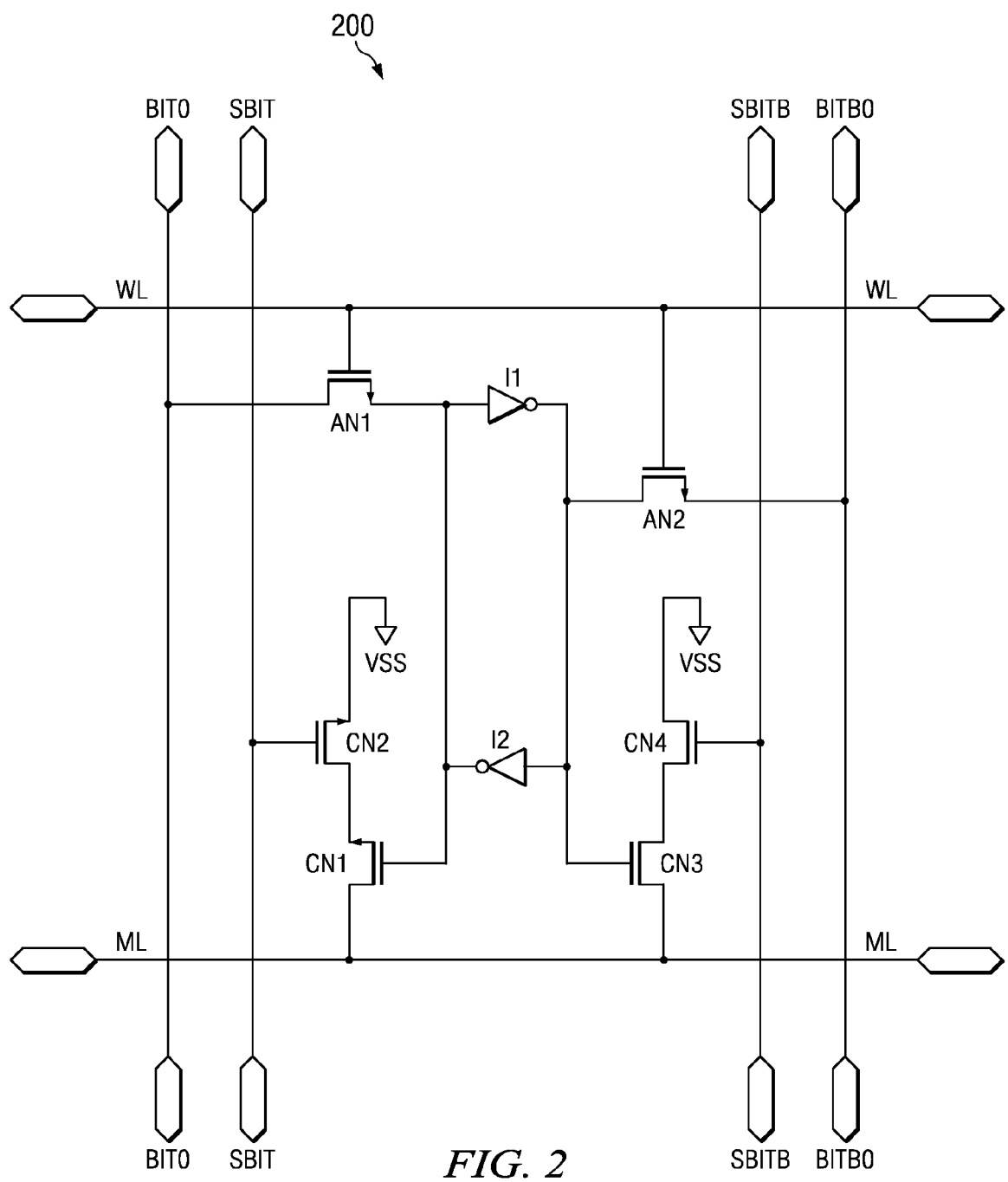
FIG. 2 is a circuit diagram of a representative three port CAM cell including a memory element and its search related circuitry shown in FIG. 1, according to an embodiment.

FIG. 2 is a circuit diagram 200 of a representative three port CAM cell (e.g., the CAM cell 150 of FIG. 1) including a memory element and its search related circuitry illustrated in FIG. 1, according to one embodiment. As shown in FIG. 2, the CAM cell 150 includes a pair of memory elements and its associated NMOS based pair of compare circuits. Each of the memory elements includes a pair of back to back inverters I1 and I2, and a pair of access transistors AN1 and AN2. Each of the compare circuits includes a pair of NMOS transistors CN1, CN2, CN3 and CN4. Match Line (ML) runs horizontally through the TCAM cell. The circuit includes a pair of read/write bit line and an associated read/write complement bit line, BIT0 and BITB0 respectively, and a pair of search bit lines SBIT and SBITB.

FIG. 3 is a circuit diagram 300 illustrating the major components and their interoperations during a clock cycle of the three port CAM 100 shown in FIG. 1, according to an embodiment. Particularly, FIG. 3 illustrates operational aspects of the array of CAM cells 110, the control circuit 120, the priority encoder 130, the write/search bit line decoder and driver circuit 122 and a tracking circuitry 310.

The three port CAM 100 includes an input port (DATAIN [0: m]) to receive a search request for data at a user specified address, a write enable signal port 122A and a CAM device 110 coupled to the write enable signal port 122A. Further, the write/search bit line decoder and driver circuit 122 includes a D latch, a search circuit (i.e., SRCH CKT) and a write circuit (i.e., WRT CKT).

In operation, the user provided data is latched in the D latch and the output of the D latch is fed to the search circuit. The user provided data is compared with data stored in the CAM device 110 through the search (SRCH) lines. In these embodiments, the search bit line enables simultaneous data searching in each CAM cell 150 in a column from the query input. The output of the CAM device 110 is fed to the match sense circuit in the priority encoder 130 through the match lines.

The three port CAM 100 also includes a priority encoder 130 coupled to the CAM device 110 to receive match signals and to output hit/miss signals upon receiving the search request for the data at a user specified address in the CAM device 110 via the input port in a given clock cycle. In operation, the priority encoder 130 includes the address encode circuit to receive the match signals and generate the hit/miss output signals upon receiving the search request for the data at a user specified address in a given clock cycle.

The three port CAM 100 also includes the control circuit 120 coupled between the priority encoder 130 and write enable signal port (WRT CKT) 122A to receive the hit/miss signals and to output a write enable signal upon detecting a miss signal. In these embodiments, the write enable signal port 122A receives the write enable signal and writes the data to the CAM device 110 at a user specified address in the same given clock cycle.

In operation, if the control circuit 120 receives a hit signal, then the address associated with the hit signal is outputted, else, the miss signal is fed as input to clock domain 2 as illustrated in FIG. 3. Further, the clock domain 2 generates an internal write clock (WCLK) to the write circuit through a delay circuit driven by the same clock cycle.

In one embodiment, clock domain 1 generates an internal search clock (ICLK), which combines with SRCH input to generate search enable (EN_SRCH) signal to the search circuit and delayed ICLK (i.e., DCLK) combines with WRT input to generate write enable (EN_WT) signal in a given clock cycle. For normal write, the ICLK is delayed to give more time for previous search and write cycle to finish. This procedure gives better cycle time of operation. Clock domain 2 generates an internal write clock (WCLK) to the write circuit in same given clock cycle, if search results in a miss in that particular cycle. This write clock combined with WRT input to generate EN_WRT to perform write after search in the same clock cycle In operation, the write circuit (WRT CKT) writes the data to the CAM device 110 at a user specified address using the associated read/write bit lines (R/W bit lines) in the same given clock cycle upon receiving the write enable signal from the clock domain 2.

In these embodiments, both the search and write operations are performed only if the search enable (EN_SRCH) is high and write enable (EN_WRT) is low. If both search EN_SRCH and EN_WRT are high, then only search operation will be performed. Further, if both the inputs are low then only write operation will be performed. In addition, if EN_SRCH is low and EN_WRT is high then only read operation will be performed.

The tracking circuit 310 generates dummy search lines, dummy match lines and dummy word lines through the dummy circuits and dummy rows. The tracking circuitry 310 is used to emulate actual data path and to generate a signal to terminate the internal cycle for these self timed memories. In one embodiment of the present invention, for search and write cycle, first tracking signal is triggered by external clock, which triggers the dummy search lines, and dummy search lines further trigger the dummy match lines which generate a dummy hit. This dummy hit is generated at the same time when hit/miss signal would have arrived at output. Further, this dummy hit is used to latch the output when data is ready at output. For search and write cycle, the dummy hit is used as a trigger to generate a write clock in clock domain 2. The write clock generated dummy bit lines and a signal is generated at the same time when the data is written into memory. This signal terminates the WCLK to signify end of the write cycle.

In accordance with the above-described operations, the three port CAM 100 or a multi port CAM includes an I/O driver 125 including an input port (DATAIN [0: m]) to receive the search request for the data at a user specified address. In some embodiments, the write/search bit line decoder and driver circuit 122 including the write enable signal port 122A is coupled to the I/O driver 125. In some embodiments, the CAM device 110 is coupled to the write/search bit line decoder and driver circuit 122 and the priority encoder 130 is coupled to the CAM device 100 to receive match signals and output hit/miss signals upon receiving the search request for the data at a user specified address in the CAM device 110 via the input port of the I/O driver 125 in a given clock cycle.

Also, the control circuit 120 is coupled between the priority encoder 130 and the write/search bit line decoder and driver circuit 122 to receive the hit/miss signals and to output a write enable signal (EN_WRT) upon detecting a miss signal (e.g., MISS as illustrated in FIG. 3). The write/search bit line decoder and driver circuit 122 receives the write enable signal (EN_WRT) via the write enable signal port 122A and writes the data to the CAM device 110 at another user specified address using the associated read/write bit line and read/write bit complement line (e.g., R/W bit lines illustrated in the write/search bit line decoder and driver circuit 122 of FIG. 3) in the same given clock cycle.

The three port CAM 100 further includes an associated read/write bit line and a read/write bit complement line coupled between the CAM device 110 and the write/search bit line decoder and driver circuit 122. The three port CAM 100 also includes a search bit line and a search bit complement line (e.g., SRCH lines illustrated in the write/search bit line decoder and driver circuit 122 of FIG. 3) that are connected between the CAM device 110 and the write/search bit line decoder and driver circuit 122.

In addition, the three port CAM 100 includes a plurality of global match lines (e.g., match lines connected between the array of CAM cells 110 and priority encoder 130 of FIG. 1 and FIG. 3) coupled to associated outputs of the CAM device 110. In some embodiments, the priority encoder 130 coupled to the plurality of global match lines via the match sensing circuit 132 receives the match signals and outputs hit/miss signals upon receiving the search request for the data at a user specified address in the CAM device 110 via the input port of the I/O driver 125 and the associated search bit line and the search bit complement line in a given clock cycle.

The control circuit 120 coupled between the priority encoder 130 and the write/search bit line decoder and driver circuit 122 receives the hit/miss signals and outputs a write enable signal (EN_WRT) upon detecting a miss signal. The write/search bit line decoder and driver circuit 122 receives the write enable signal (EN_WRT) via the write enable signal port 122A and writes the data to the CAM device 110 at another user specified address using the associated read/write bit line and read/write bit complement line in the same given clock cycle.

The CAM device 110 includes multiple CAM blocks, each CAM block includes a plurality of CAM cells 150. In these embodiments, the associated read/write bit line and the read/write bit complement line are coupled between each CAM cell 150 and the write/search bit line decoder and driver circuit 122, and the search bit line and the search bit complement line are connected between each CAM cell 150 and the write/search bit line decoder and driver circuit 122.

The control circuit 120 includes the miss signal processing circuit 120A to receive the hit/miss signals and to output a write enable signal (EN_WRT) upon detecting a miss signal and the write/search bit line decoder and driver circuit 122 to receive the write enable signal via the write enable signal port 122A and to write the data to one of CAM cells 150 at another user specified address using the associated read/write bit line and read/write bit complement line in the same given clock cycle. In some embodiments, the I/O driver 125 includes an I/O processing circuit 125A for receiving the search request for the data at the user specified address via the input port and forwards it to the write/search bit line decoder and driver circuit 122.

Figure 4:
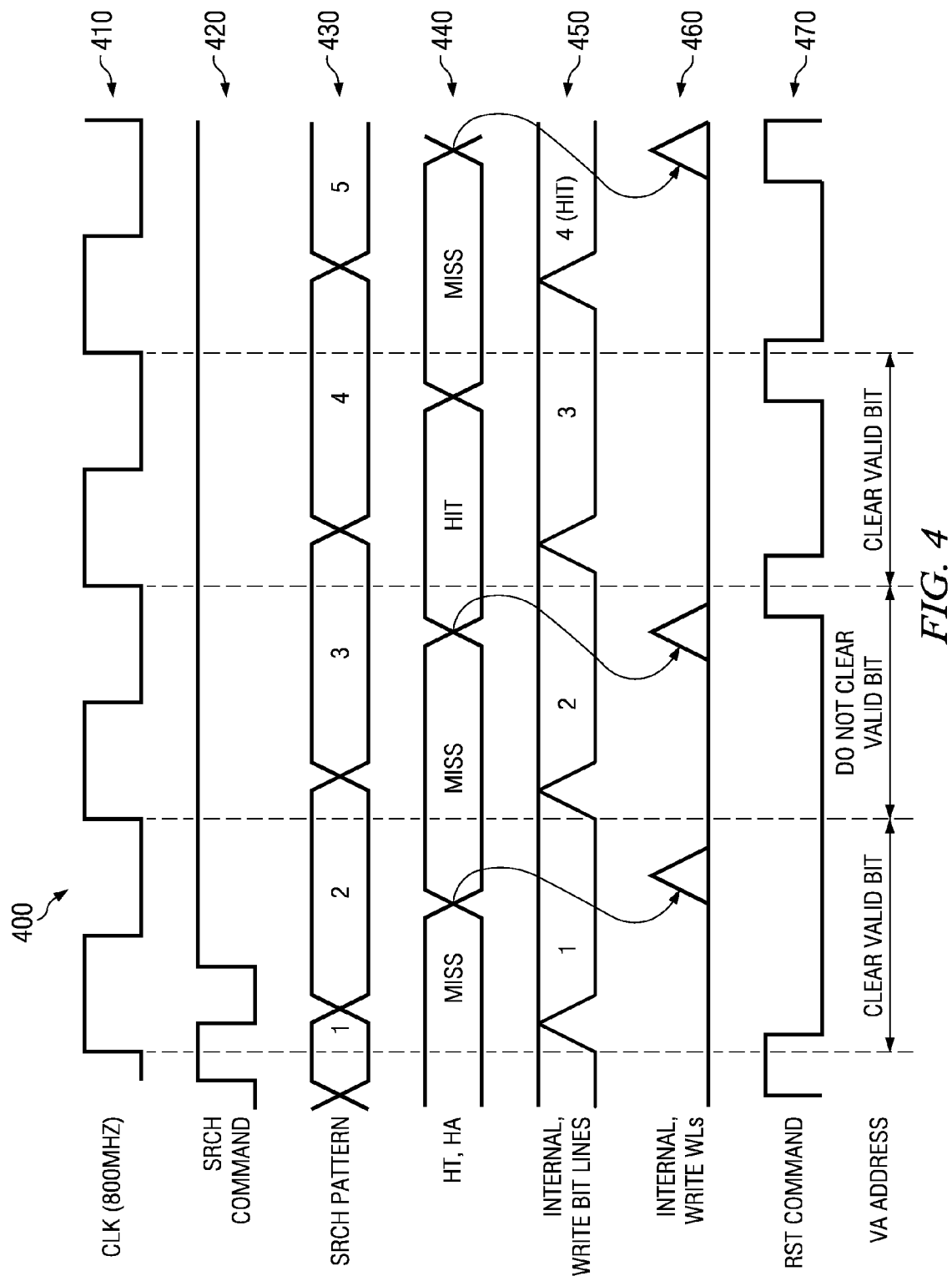
FIG. 4 is a timing diagram illustrating the operation of three port CAM shown in FIG. 1, according to an embodiment.

FIG. 4 is a timing diagram 400 illustrating the operation of three port CAM 100, shown in FIG. 1, according to one embodiment. Particularly, FIG. 4 depicts the timing diagram for the search, write and clear valid bit operations described above as exemplified with respect to the three port CAM 100. As illustrated in FIG. 4, a clock signal 410 periodically cycles at a system clock rate. To enable the CAM for search or RAM operations, the EZ (memory select) input must be held low prior to the rising edge of the CLK. To disable the CAM, the EZ input must be held high prior to the rising edge of the CLK. When the CAM is disabled, all other control inputs are ignored and the contents of the memory array as well as all values on the output pins retain their previous values.

The write cycle is initiated by having all control inputs low, prior to the rising edge of CLK. In the write mode, the values present on the read/write lines are written to the CAM cells 150 of the CAM device 110. The CAM system 100 permits the three port search operation, where, search, write at user specified address if search results as miss, and valid bit reset at another user specified address are performed simultaneously in one clock cycle. This cycle is initiated by holding EZ (memory select) and WZ (write select) control pins low and SRCH and RST control pins high prior to the rising edge of CLK.

The search input signal is received at the input port of the I/O driver 125 and sent to the CAM device 110 using the search lines. The search data is then compared with the data stored in each CAM cell 150 of the CAM device 110. In these embodiments, as illustrated in FIG. 4, the timing diagram 420 illustrates the search command provided during the first clock cycle. The timing diagram 430 depicts the search pattern for matching the search data with the data stored in the CAM cells 150.

The priority encoder 130 receives the match signals through the match lines and outputs hit/miss signals during the same first clock cycle. The timing diagram 440 illustrates the Hit Flag output (HT) and Hit Address output (HA) indicating a hit and hit address respectively. During the first clock, since, HT/HA results in a miss, the control circuit 120 outputs a write enable (EN_WRT) signal. The write/search bit line decoder and driver circuit 128 receives the write enable signal and writes the data to the CAM device 110 at a user specified address using the R/W bit lines and R/W bit complement lines (e.g., as illustrated in the timing diagram 450 of FIG. 4) in the same first clock cycle as illustrated in FIG. 4. The timing diagram 460 illustrates the data written to CAM in the first clock cycle as the search operation results in a miss.

Also, during the first clock cycle, since the input Valid Bit Reset (RST) is held high, the valid bit corresponding to a user specified address is reset. The timing diagram 470 illustrates the reset command signal. In one embodiment, the valid bit clear operation is performed along with the search and write operations in the same first clock cycle.

Similarly, during the second clock cycle, the matching of data results in a miss and concurrently, data is written to the CAM device 110. But the clear valid bit operation is not performed since the reset command is held low during the second clock cycle. In these embodiments, the CAM system 100 permits only the two port search operation, where search, write at user specified address if search results as miss are performed simultaneously but valid bit reset is not performed. This cycle is initiated by holding EZ, WZ and RST control pins low and the SRCH control pin high prior to the rising edge of CLK.

Similarly, during the third clock cycle, the output of the priority encoder 130 results in a hit. Therefore, write operation is not performed and the Hit Address (HA) associated with the hit signal is outputted through the control circuit 120. Since the RST command is held high, the valid bit clear operation is performed in the third clock cycle.

The three port CAM 100 described herein, permits concurrent functioning of:
1. searching data in the CAM cells 150 of the CAM cell array 110 and outputting a hit/miss signal based on the comparison.
2. writing the data to the CAM device or CAM cell array 110 at a user specified address.
3. clearing the valid bit address upon receiving another user specified address.

The above mentioned three operations can be executed in one clock cycle, thus increasing the speed of operation and consequent saving of time required to finish processing cycles.

Figure 5:
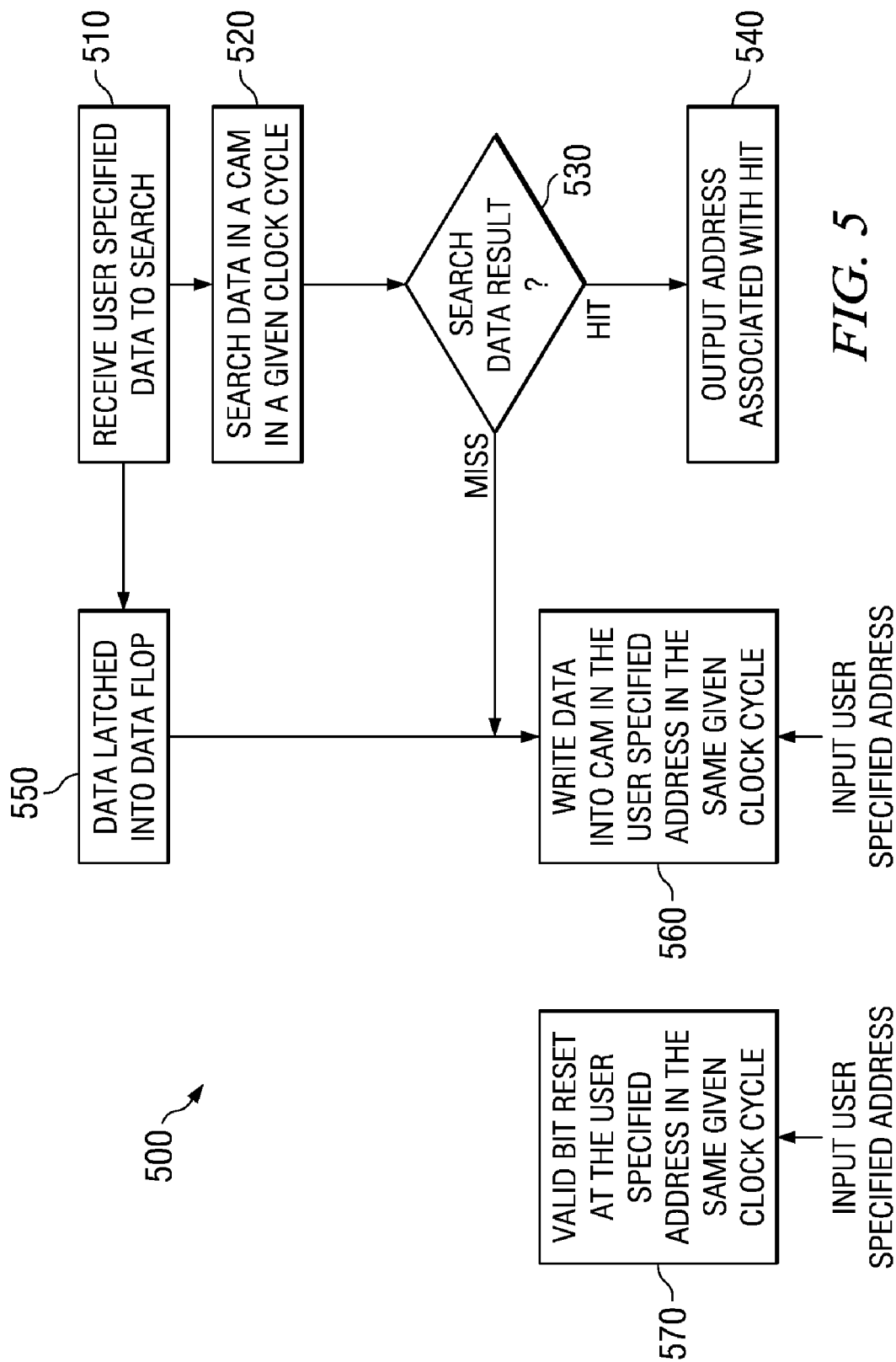
FIG. 5 is a flow chart illustrating the operation of a three port CAM shown in FIG. 1, according to an embodiment of the present invention.

FIG. 5 is a flow chart 500 illustrating the operation of a three port CAM 100 shown in FIG. 1, according to an embodiment of the present invention. In operation 510, user specified data is received to search for data in the CAM device 110. In these embodiments, an I/O driver 125 including an input port (DATAIN [0: m]) receives a search request for a data at a user specified address. Further, the I/O driver 125 includes an I/O processing circuit 125A for receiving the search request for the data at the user specified address via the input port and forwards it to the write/search bit line decoder and driver circuit 122.

In operation 520, the data is searched in the CAM device 110 in a given clock cycle. In these embodiments, a search bit line and a search bit complement line are connected between the CAM device 110 and the write/search bit line decoder and driver circuit 128 to compare the user specified data with the data stored in the CAM device 110. The output of the CAM device 110 is sent to the priority encoder 130 through the match lines. In some embodiments, a plurality of global match lines are coupled to associated outputs of the CAM device 110 to send the output of CAM device 110 to the priority encoder 130.

In operation 530, the priority encoder 130 determines the result associated with the search data. In these embodiments, the priority encoder 130 coupled to the CAM device 110 receives match signals and output hit/miss signals upon receiving the search request for the data at a user specified address in the CAM device 110 via the input port of the I/O driver 125 in a given clock cycle.

In operation 540, address associated with the hit signal is outputted upon detecting the hit signal in operation 530. In operation 550, the user specified data is latched into data flop. In operation 560, the user specified data is written to the CAM device 110 in a user specified address in the same given clock cycle.

In accordance with operations 530, 540, 550 and 560, the control circuit 120 coupled between the priority encoder 130 and the write/search bit line decoder and driver circuit 122 receives the hit/miss signals and outputs a write enable signal (EN_WRT) upon detecting a miss signal, and the write/search bit line decoder and driver circuit 122 receives the write enable signal via the write enable signal port 122A and writes the data to the CAM device 110 at a user specified address using the associated read/write bit line and read/write bit complement line in the same given clock cycle.

In some embodiments, the priority encoder 130 coupled to the plurality of global match lines via a match sensing circuit 132 receives the match signals and output hit/miss signals upon receiving the search request for the data at a user specified address in the CAM device 110 via the input port of the I/O driver 125 and the associated search bit line and the search bit complement line in a given clock cycle.

The control circuit 120 coupled between the priority encoder 130 and the write/search bit line decoder and driver circuit 122 receives the hit/miss signals and outputs a write enable signal upon detecting a miss signal. The write/search bit line decoder and driver circuit 122 receives the write enable signal via the write enable signal port 122A and writes the data to the CAM device 110 at a user specified address using the associated read/write bit line and read/write bit complement line in the same given clock cycle. Further, a miss signal processing circuit 120A receives the hit/miss signals and outputs a write enable signal upon detecting a miss signal.

In operation 570, the valid bit corresponding to a user specified address is allowed to reset by holding the valid bit reset high. In these embodiments, the control circuit 120 includes the valid bit clear control circuit 120B and associated RST command port and a VA address-to-clear port for performing a valid bit clear, upon receiving a user specified address via the RST command port and the VA address-to-clear port, respectively in the same given clock cycle.

Figure 6:
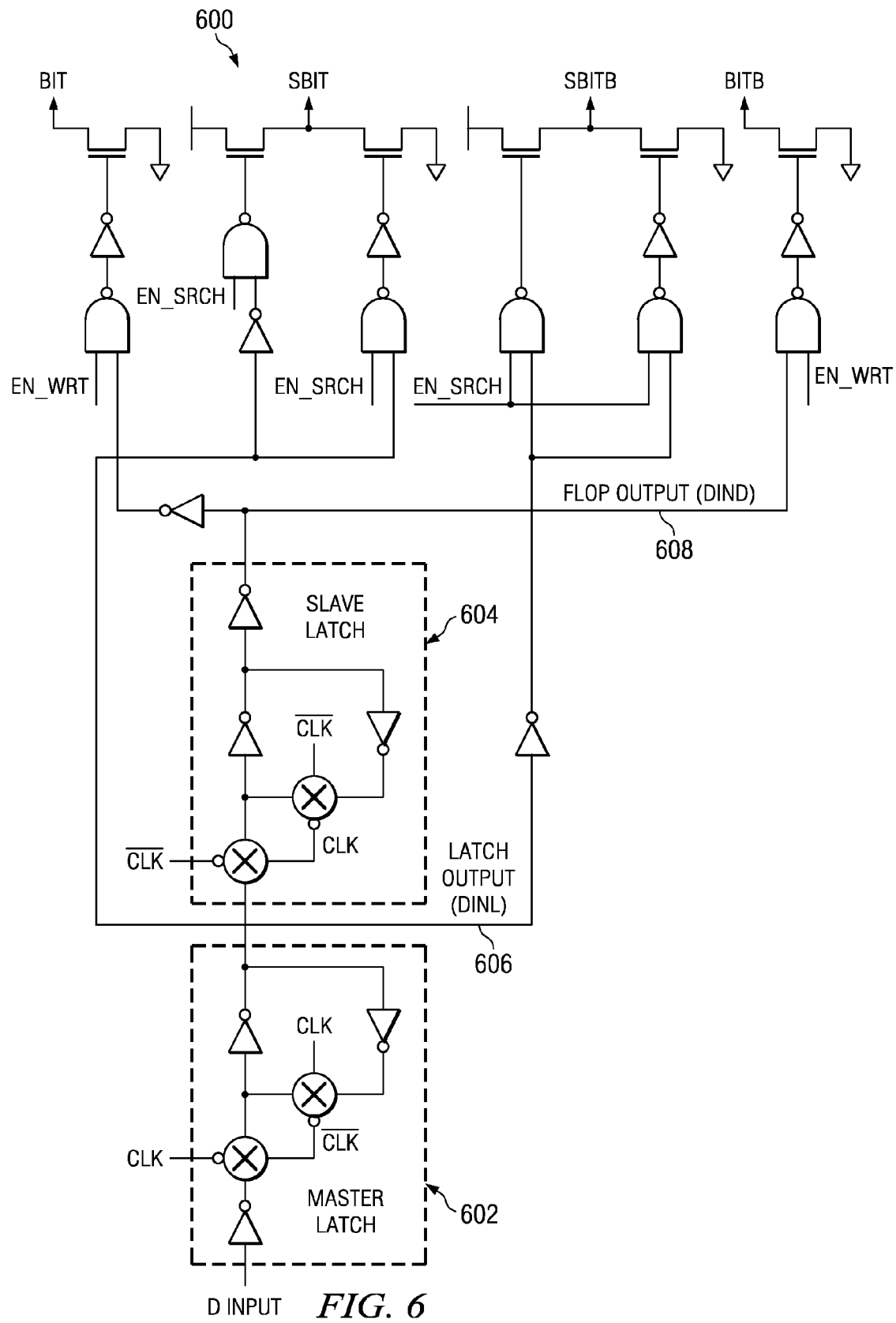
FIG. 6 is a circuit diagram of the I/O processing circuit of FIG. 1, according to an embodiment.

FIG. 6 is a circuit diagram 600 of the I/O processing circuit 125A of FIG. 1, according to an embodiment. As explained in FIG. 3, the D input is stored into the flip-flop having a master latch 602 and a slave latch 604. In these embodiments, the master latch 602 and the slave latch 604 are driven by the same clock signal. During the normal search or normal write operation, DINL (Latched Data Input) output 606 of the master latch is provided to the write/search bit line decoder and driver circuit 122. In case of search and write operation, the write/search bit line decoder and driver circuit 122 takes the flop output (DIND) (Registered Data) 608 as illustrated in FIG. 6.

Further, the EN_SRCH and EN_WRT are the input signals to the search circuit and write circuit respectively, from the control circuit 120. The search bit line (SBIT) and search bit complement line (SBITB) enable simultaneous data searching in each CAM cell 150 of the CAM device 110 based on the query input data (D INPUT). The write bit line (BIT) and write bit complement line (BBIT) are used to write the data to the CAM device 110 at a user specified address in the same given clock cycle, upon detecting a miss signal by the control circuit 120.

In one embodiment, the write/search bit line decoder and driver circuit 122 takes the latch output (DINL) 606 for search operation, and if the search results in a miss, the control circuit 130 generates an EN_WRT signal which triggers the write/search bit line decoder and driver circuit 122 which further takes the flop output (DIND) 608 to write the data to the CAM device 110.

Figure 7:
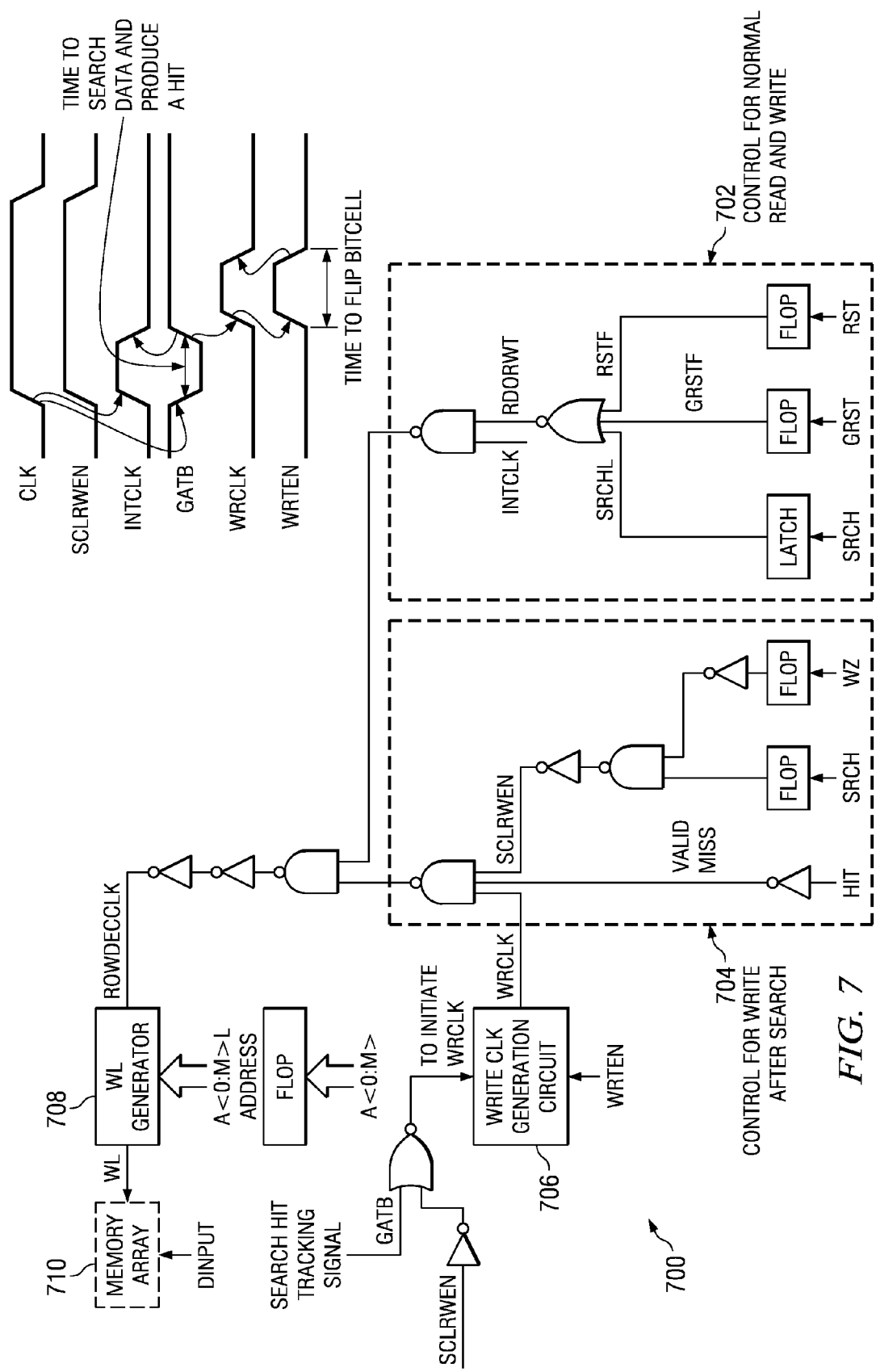
FIG. 7 is a circuit diagram of the miss signal processing circuit of FIG. 1, according to an embodiment.

FIG. 7 is a circuit diagram 700 of the miss signal processing circuit 120A of FIG. 1, according to an embodiment. Particularly, FIG. 7 illustrates the miss signal processing unit 120A to perform a write operation after search operation, when the search operation results in a miss.

The miss signal processing circuit 120A receives the hit/miss signals and outputs a write enable signal upon detecting a miss signal. In some embodiments, the write/search bit line decoder and driver circuit 122 receives the write enable signal via the write enable signal port 122A and writes the data to one of CAM cells 150 of the CAM device 110 at a user specified address using the associated read/write bit line and read/write bit complement line in the same given clock cycle.

The CAM system 100 can also operate in normal read or write mode, that is selected by holding the GRST, SRCH and RST inputs low prior to the rising edge of CLK and holding WZ input high in case of read, and holding WZ input low in case of write. In these embodiments, control for normal read and write circuit 702 is exercised to perform read and write operation.

The CAM system 100 also performs write operation after search operation, that is selected by holding the WZ input low and SRCH input high prior to the rising edge of CLK. In these embodiments, control for write after search circuit 704 is configured to perform the write operation after search operation. Further, the write clock generation circuit 706 generates a write clock (WRCLK) if the search operation results in a miss. In some embodiments, a search hit tracking signal and the SCLRWEN signal are fed to GATB which outputs a signal to initiate the write clock generation circuit 706. As a result, the WL generator 708 generates the word line (WL) for user provided address and input data (DINPUT) is written into memory array 710. For normal write cycle, the DINPUT is taken from the master latch 602 and for search and write cycle, DINPUT is taken from the slave latch 604 which outputs the registered data.

In some embodiments, after power-up, the state of all internal CAM memory locations and control input pin latches will be unknown. Therefore, it is necessary to initialize the CAM by performing a global valid bit reset (GRST) operation before any other CAM or RAM operation is attempted. The global valid bit reset is accomplished by holding SRCH low and GRST high prior to the rising edge of CLK. As a result, the memory locations in the CAM are marked as empty.

The CAM system 100 contains "valid bits" (e.g., associated with each memory location in the CAM device 110) that are used to keep track of addresses that have been written to and ensure that searches are performed only on locations which contain valid data. Whenever any data is written into memory for an address, that particular valid address bit is made high. Another function of valid bit clear resets the valid bit state to low for a given address.

The CAM system 100 also permits individual valid bits to be reset in the "valid bit reset" or "valid bit clear" operating mode, similar to the "global valid bit reset". The valid bit reset mode only marks the word indexed by the VA input bus as empty.

Figure 8:
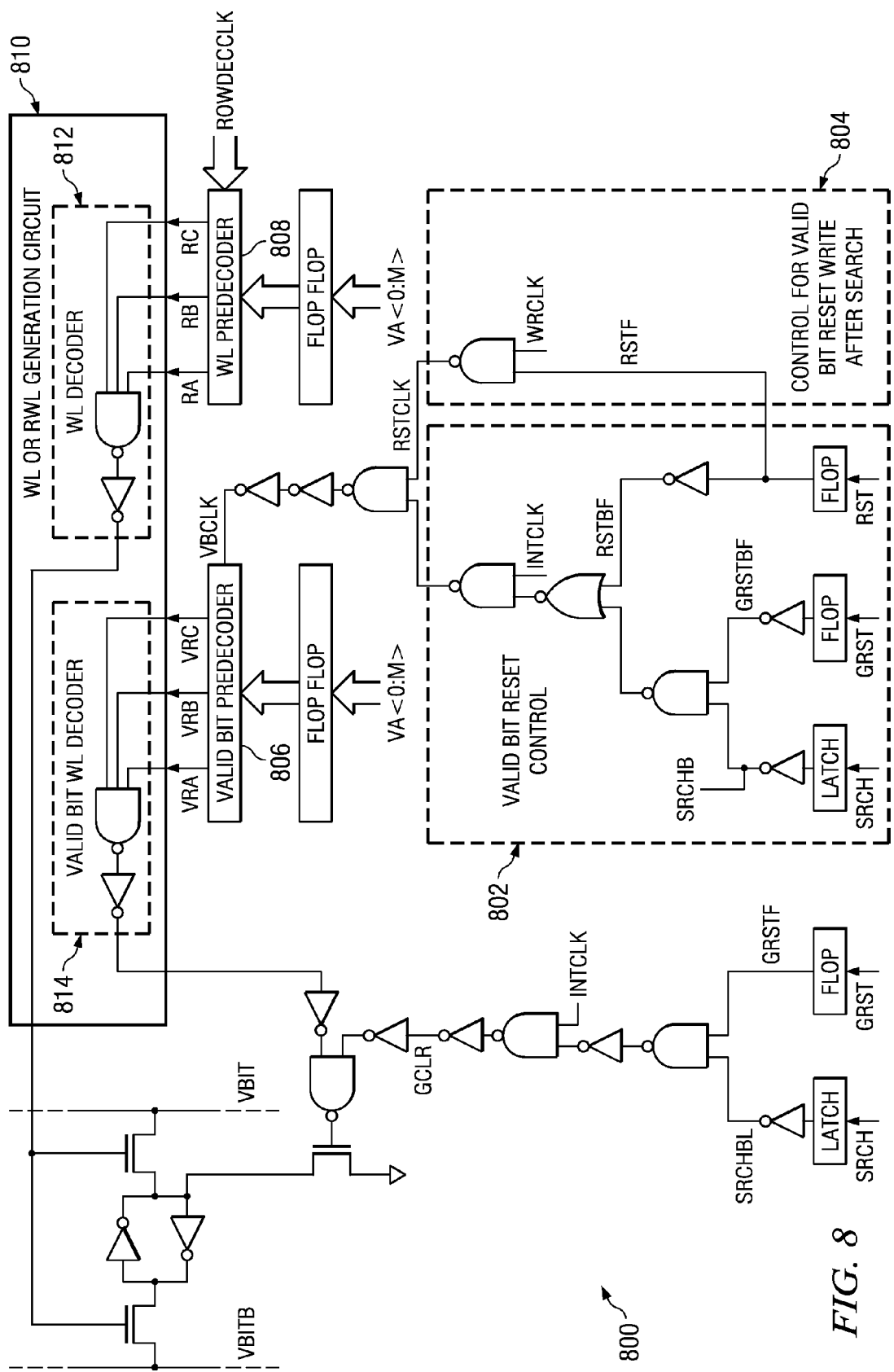
FIG. 8 is a circuit diagram of the valid bit clear control circuit of FIG. 1, according to an embodiment.

FIG. 8 is a circuit diagram 800 of a valid bit clear circuit 120B of FIG. 1, according to an embodiment. The control circuit 120 includes a valid bit clear control circuit 120B and associated RST command port and a VA address-to-clear port for performing a valid bit clear upon receiving a user specified address via the RST command port and the VA address-to-clear port, respectively in the same given clock cycle.

The CAM system 100 can also operate in the three port search operation, where, search, write at a user specified address if search results in a miss and valid bit reset at another user specified address are performed simultaneously. The three port search operation is initiated by holding EZ and WZ (WRCLK) control pins low and SRCH and RST control pin high prior to the rising edge of CLK.

It can be noted that, the CAM system 100 permits the two port search operation, where, search and write at a user specified address if search results as a miss are performed simultaneously but valid bit reset is not performed. The two port search operation is initiated by holding EZ, WZ and RST control pins low and SRCH control pin high prior to the rising edge of CLK. For both the above mentioned operations, the write data will be the same as search data.

The write address and valid bit reset address provided by a user should not be the same. In these embodiments, the valid bit reset control circuit 802 and the control for valid bit reset for write after search circuit 804 are shown in FIG. 8. In one embodiment, the valid bit reset operation is performed by holding the RST input high prior to the rising edge of the clock.

In operation, the VBCLK (valid bit clock) output from the combination of the valid bit reset control circuit 802 and the control for valid bit reset for write after search circuit 804 is fed to the valid bit predecoder 806 which generates reset signals VRA, VRB, and VRC upon receiving the VB CLK signal. Further, WL predecoder 808 generates predecoded address RA, RB and RC signals to the WL generation circuit 810 upon receiving the row decoder clock (ROWDECCLK) signal. The WL decoder 812 generates a WL (word line) to write the data to the CAM device 110 at a user specified address and the valid bit WL decoder 814 generates a valid bit clear word line (VWL) to perform the valid bit reset at a user specified address in one clock cycle as illustrated in FIG. 8.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

The invention claimed is:

1. A multiport CAM, comprising:
an I/O driver including an input port (DATAIN [0: m]) to receive a search request for a data at a user specified address;
a write/search bit line decoder and driver circuit including a write enable signal port is coupled to the I/O driver;
a CAM device coupled to the write/search bit line decoder and driver circuit;
a priority encoder coupled to the CAM device to receive match signals and output hit/miss signals upon receiving the search request for the data at a user specified address in the CAM device via the input port of the I/O driver in a given clock cycle; and
a control circuit coupled between the priority encoder and the write/search bit line decoder and driver circuit to receive the hit/miss signals and to output a write enable signal upon detecting a miss signal and wherein the write/search bit line decoder and driver circuit to receive the write enable signal via the write enable signal port and write the data to the CAM device at a user specified address using the associated read/write bit line and read/write bit complement line in the same given clock cycle,
wherein the control circuit further comprises a valid bit clear control circuit and associated Valid Bit Reset (RST) command port and a VA address-to-clear port for performing a valid bit clear upon receiving a user specified address via the RST command port and the VA address-to-clear port, respectively, in the same given clock cycle.

2. The multiport CAM of claim 1, further comprising:
an associated read/write bit line and a read/write bit complement line coupled between the CAM device and the write/search bit line decoder and driver circuit;
a search bit line and a search bit complement line that are connected between the CAM device and the write/search bit line decoder and driver circuit; and
a plurality of global match lines coupled to associated outputs of the CAM device, wherein the priority encoder coupled to the plurality of global match lines via a match sensing circuit to receive the match signals and output hit/miss signals upon receiving the search request for the data at a user specified address in the CAM device via the input port of the I/O driver and the associated search bit line and the search bit complement line in a given clock cycle, and wherein the control circuit coupled between the priority encoder and the write/search bit line decoder and driver circuit to receive the hit/miss signals and to output a write enable signal upon detecting a miss signal and wherein the write/search bit line decoder and driver circuit to receive the write enable signal via the write enable signal port and write the data to the CAM device at a user specified address using the associated read/write bit line and read/write bit complement line in the same given clock cycle.

3. The multiport CAM of claim 1, wherein the CAM device comprises:
multiple CAM blocks, wherein each CAM block includes a plurality of CAM cells, wherein the associated read/write bit line and the read/write bit complement line are coupled between each CAM cell and the write/search bit line decoder and driver circuit, and wherein the search bit line and the search bit complement line are connected between each CAM cell and the write/search bit line decoder and driver circuit.

4. The multiport CAM of claim 3, wherein the control circuit comprises:
a miss signal processing circuit to receive the hit/miss signals and to output a write enable signal upon detecting a miss signal and wherein the write/search bit line decoder and driver circuit to receive the write enable signal via the write enable signal port and write the data to one of CAM cells at a user specified address using the associated read/write bit line and read/write bit complement line in the same given clock cycle.

5. The multiport CAM of 1, wherein the I/O driver comprises an I/O processing circuit for receiving the search request for the data at the user specified address via the input port and forward it to the write/search bit line decoder and driver circuit.

6. A three port CAM, comprising:
an input port (DATAIN [0: m]) to receive a search request for a data at a user specified address;
a write enable signal port;

a CAM device coupled to the write enable signal port;

a priority encoder coupled to the CAM device to receive match signals and output hit/miss signals upon receiving the search request for the data at a user specified address in the CAM device via the input port in a given clock cycle; and a control circuit coupled between the priority encoder and write enable signal port to receive the hit/miss signals and to output a write enable signal upon detecting a miss signal and wherein the write enable signal port to receive the write enable signal and write the data to the CAM device at a user specified address in the same given clock cycle;

an I/O driver including an input port (DATAIN [0: m]) to receive the search request for a data at the user specified address; and a write/search bit line decoder and driver circuit including the write enable signal port is coupled to the I/O driver, wherein the CAM device is coupled to the write/search bit line decoder and driver circuit, wherein the priority encoder is coupled to the CAM device to receive match signals and output hit/miss signals upon receiving the search request for the data at a user specified address in the CAM device via the input port of the I/O driver in a given clock cycle, and wherein the control circuit is coupled between the priority encoder and the write/search bit line decoder and driver circuit to receive the hit/miss signals and to output a write enable signal upon detecting a miss signal and wherein the write/search bit line decoder and driver circuit to receive the write enable signal via the write enable signal port and write the data to the CAM device at a user specified address using the associated read/write bit line and read/write bit complement line in the same given clock cycle, wherein the control circuit further comprises a valid bit clear control circuit and associated RST command port and a VA address-to-clear port for performing a valid bit clear upon receiving a user specified address via the RST command port and the VA address-to-clear port, respectively, in the same given clock cycle.

7. The three port CAM of claim 6, further comprising:

an associated read/write bit line and a read/write bit complement line coupled between the CAM device and the write/search bit line decoder and driver circuit;

a search bit line and a search bit complement line that are connected between the CAM device and the write/search bit line decoder and driver circuit; and a plurality of global match lines coupled to associated outputs of the CAM device, wherein the priority encoder coupled to the plurality of global match lines via a match sensing circuit to receive the match signals and output hit/miss signals upon receiving the search request for the data at a user specified address in the CAM device via the input port of the I/O driver and the associated search bit line and the search bit complement line in a given clock cycle, and wherein the control circuit coupled between the priority encoder and the write/search bit line decoder and driver circuit to receive the hit/miss signals and to output a write enable signal upon detecting a miss signal and wherein the write/search bit line decoder and driver circuit to receive the write enable signal via the write enable signal port and write the data to the CAM device at a user specified address using the associated read/write bit line and read/write bit complement line in the same given clock cycle.

8. The three port CAM of claim 7, wherein the CAM device comprises:

multiple CAM blocks, wherein each CAM block includes a plurality of CAM cells, wherein the associated read/write bit line and the read/write bit complement line are coupled between each CAM cell and the write/search bit line decoder and driver circuit, and wherein the search bit line and the search bit complement line are connected between each CAM cell and the write/search bit line decoder and driver circuit.

9. The three port CAM of claim 8, wherein the control circuit comprises:

a miss signal processing circuit to receive the hit/miss signals and to output a write enable signal upon detecting a miss signal and wherein the write/search bit line decoder and driver circuit to receive the write enable signal via the write enable signal port and write the data to one of CAM cells at a user specified address using the associated read/write bit line and read/write bit complement line in the same given clock cycle.

10. The three port CAM of claim 6, wherein the I/O driver comprises an I/O processing circuit for receiving the search request for the data at the user specified address via the input port and forward it to the write/search bit line decoder and driver circuit.

* * * * *